(12) United States Patent
Cheng

(10) Patent No.: US 7,972,101 B2
(45) Date of Patent: Jul. 5, 2011

(54) FASTENER

(75) Inventor: Hao-Der Cheng, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/610,352

(22) Filed: Nov. 2, 2009

(65) Prior Publication Data

US 2011/0010902 A1    Jan. 20, 2011

(30) Foreign Application Priority Data

Jul. 17, 2009 (CN) .......................... 2009 1 0304458

(51) Int. Cl.
*F16B 21/18* (2006.01)
(52) U.S. Cl. ........................................ 411/522; 411/508
(58) Field of Classification Search .................. 411/522, 411/508, 502, 512; 361/719; 24/453, 458
See application file for complete search history.

(56) References Cited

U.S. PATENT DOCUMENTS

| | | | |
|---|---|---|---|
| 6,077,011 A * | 6/2000 | Walker | 411/348 |
| 6,307,748 B1 * | 10/2001 | Lin et al. | 361/704 |
| 6,443,679 B1 * | 9/2002 | Schwarz | 411/352 |
| 6,795,317 B1 * | 9/2004 | Liu | 361/704 |
| 7,116,556 B2 * | 10/2006 | Lee et al. | 361/704 |
| 7,219,400 B2 * | 5/2007 | Tashima et al. | 24/297 |
| 7,405,939 B2 * | 7/2008 | Yang | 361/719 |

\* cited by examiner

*Primary Examiner* — Gary Estremsky
(74) *Attorney, Agent, or Firm* — Zhigang Ma

(57) ABSTRACT

A fastener includes a push pin, a plug and an elastic member. The push pin includes a head, a shaft extending from the head, and a clipping foot extending radially from the shaft. Two through receiving holes are defined in the head. A snapping hole is defined in the head and communicates with the receiving holes. The shaft and the clipping foot are between the receiving holes. The plug includes a handle, and two insertion portions extending from the handle. A raised point extends from each of the insertion portions. The insertion portions of the plug can extend through the receiving holes respectively until the raised points are snapped in the snapping hole and the insertion portions extend adjacent to the clipping foot. The elastic member can engage with the push pin to supply an elastic force pointing from the clipping foot to the head to the push pin.

8 Claims, 4 Drawing Sheets

FASTENER

BACKGROUND

1. Technical Field

The present disclosure relates to fasteners, and more particularly to a fastener for a heat sink.

2. Description of Related Art

In a computer, a heat generating element, such as a central processing unit, generates heat during operation. A heat sink is often employed for evacuating heat built up in the heat generating element. However, the heat sink should be firmly fixed in the computer to closely contacted with the heat generating element, otherwise the heat generating element can not normally work and will even stop working. Therefore, a fastening device is required for fixing the heat sink.

DETAILED DESCRIPTION

Figure 3:
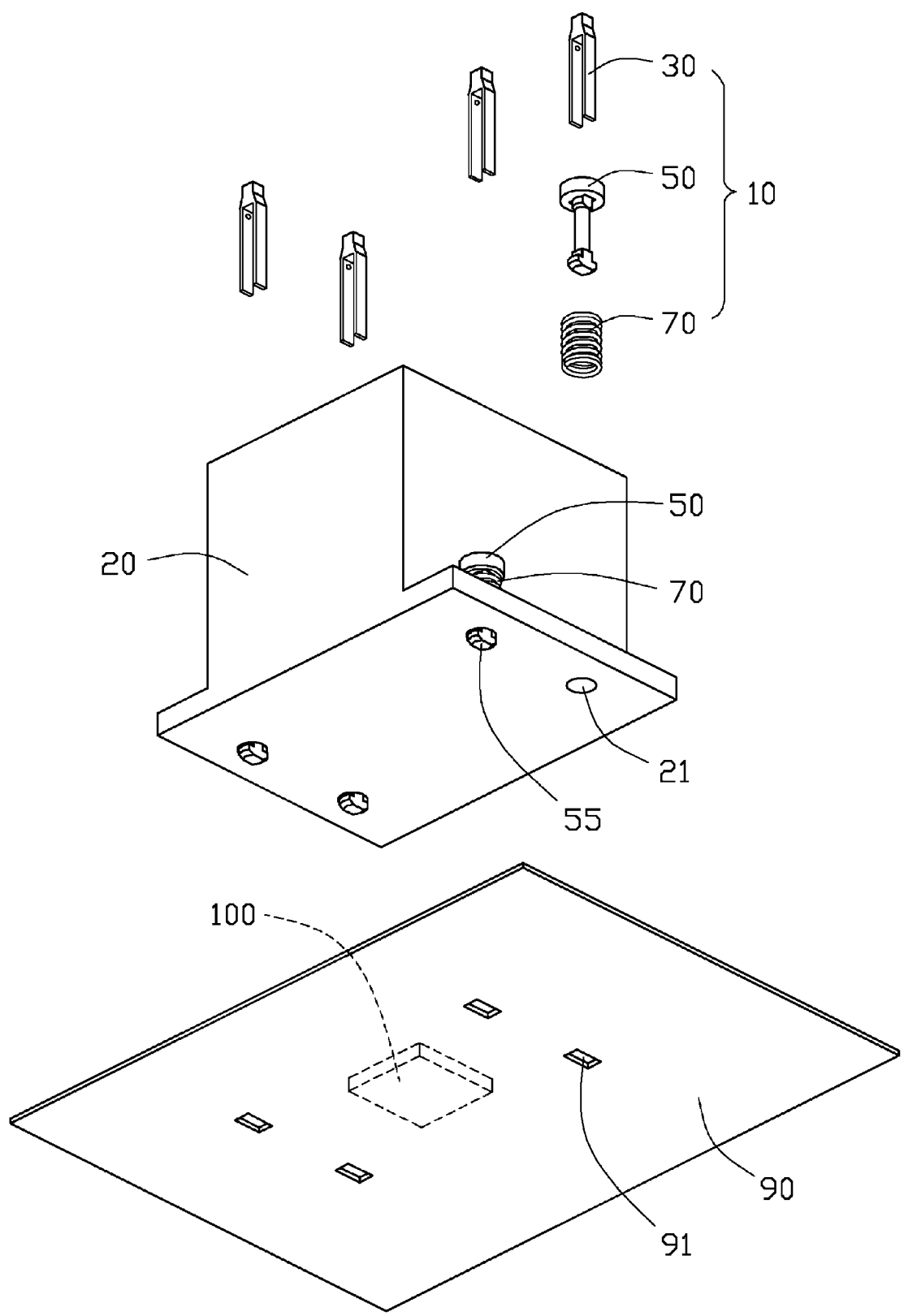
FIGS. 3 and 4 shows the plug of FIG. 1 in use.

Referring to FIG. 3, an embodiment of a fastener 10 fixes a heat sink 20 to a circuit board 90 for cooling a heat generating element 100, such as a central processing unit. Four through holes 21 are defined in the heat sink 20. Four elongated through clipping holes 91 are defined in the circuit board 90 around the heat generating element 100 corresponding to the through holes 21 of the heat sink 20. In one embodiment, each clipping hole 91 is rectangular.

Figure 1:
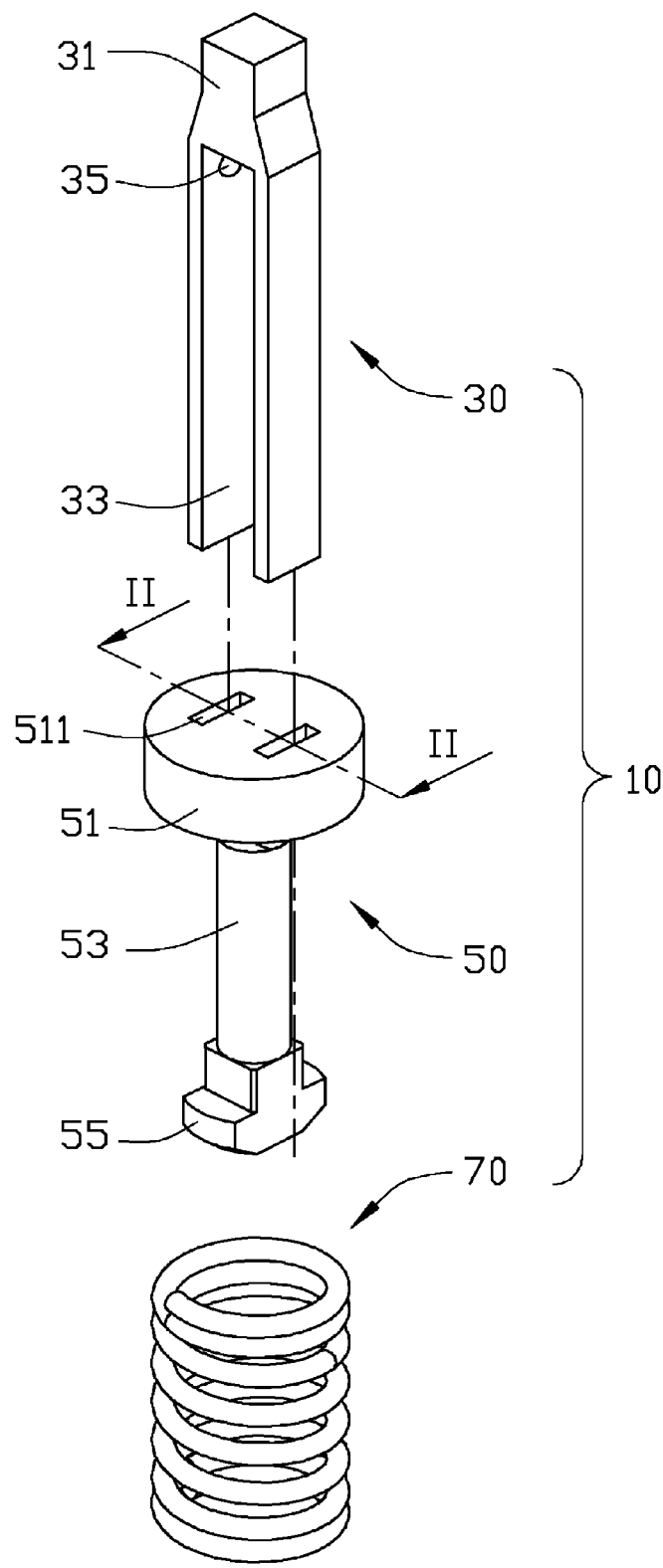
FIG. 1 is an exploded, isometric view of an embodiment of a fastener, the fastener including a plug.

Referring to FIG. 1, the fastener 10 includes a plug 30, a push pin 50, and an elastic member 70.

The plug 30 includes a handle 31, and two elongated flat insertion portions 33 depending from a bottom thereof. The insertion portions 33 are opposite to each other. A raised point 35 extends from an inner side of each insertion portion 33 adjacent to the handle 31.

Figure 2:
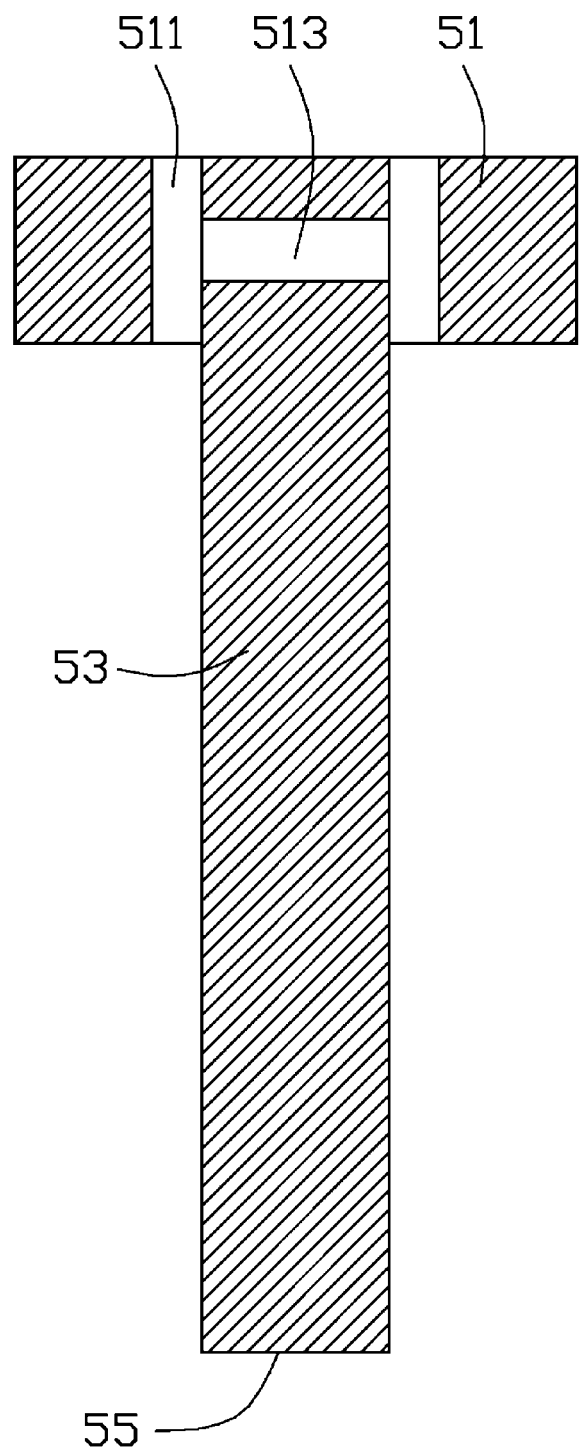
FIG. 2 is a cross-section of the plug in FIG. 1 along the line II-II.

Referring also to FIG. 2, the push pin 50 includes a short cylindrical head 51, a shaft 53 extending down from a center of a flat bottom end of the head 51, and a clipping foot 55 extending radially from a bottom end of the shaft 53. Two receiving holes 511 are defined in the head 51 corresponding to the insertion portions 33 of the plug 30. The receiving holes 511 extend through the head 51 from a flat top end to the flat bottom end of the head 51. A snapping hole 513 is defined within the head 51, communicating with the receiving holes 511. The shaft 53 is between the receiving holes 511. A longitudinal axis of the clipping foot 55 is perpendicular to the shaft 53, and corresponds to a longitudinal axis of each clipping hole 91 of the circuit board 91. The clipping foot 55 is between the receiving holes 511, and is symmetrical relative to the shaft 53. In one embodiment, a width of the foot 55 is equal to a distance between the receiving holes 511, and a length of the foot 55 exceeds the distance between the receiving holes 511.

In the present embodiment, the elastic member 70 is a spring.

Figure 4:
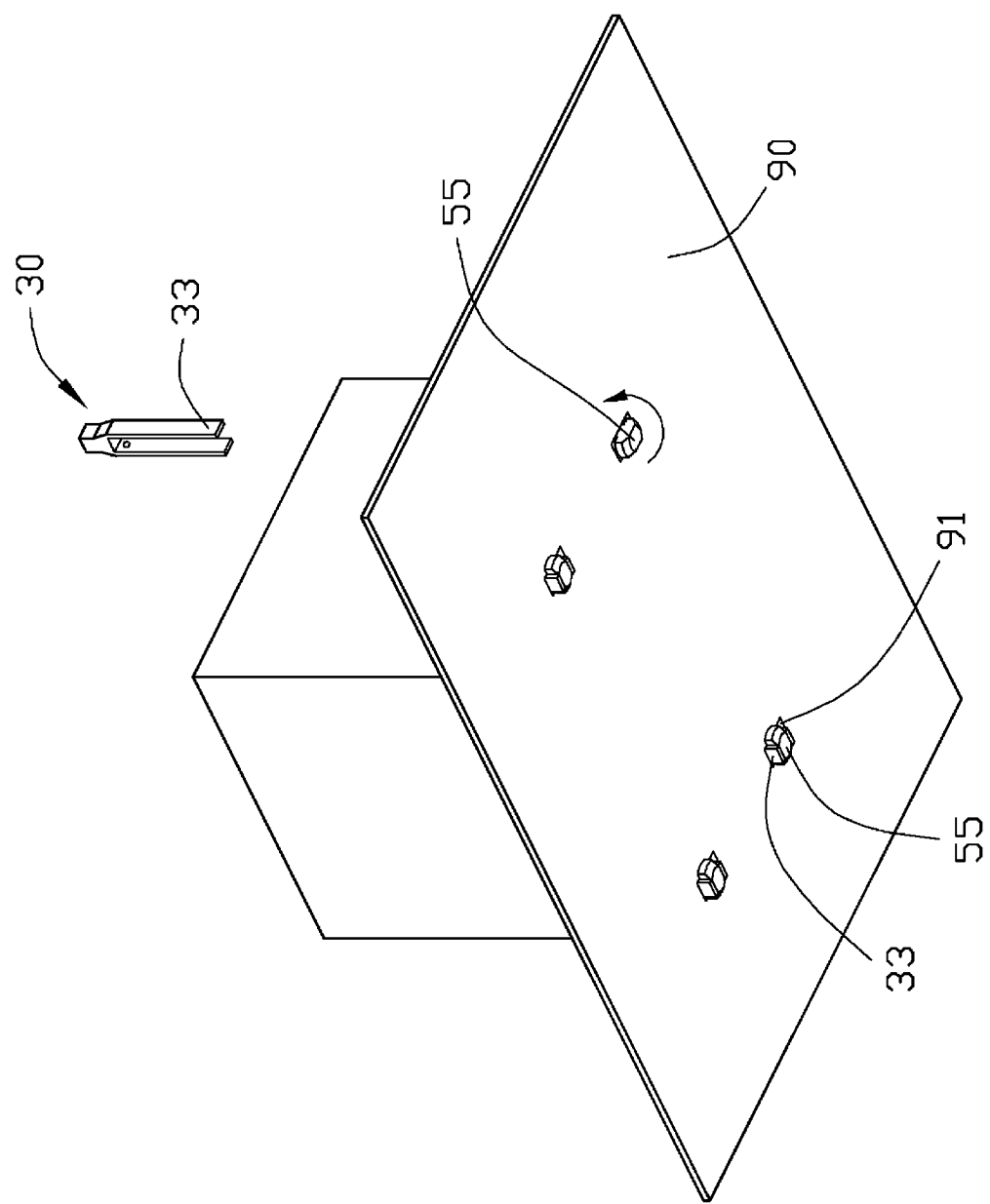

Referring to FIGS. 3 and 4, during mounting of the heat sink 20, four fasteners 10 are employed corresponding to the four through holes 21 of the heat sink 20. In the following, one of the fasteners 10 is used as an example. The clipping foot 55 of the push pin 50 is in turn extended through the spring 70 and the through hole 21 of the heat sink 20, to sandwich the spring 70 between the head 51 of the push pin 50 and the heat sink 20. A bottom of the heat sink 20 abuts the heat generating element 100 with the through holes 21 of the heat sink 20 aligning with the corresponding clipping holes 91 of the circuit board 90. The push pin 50 is rotated via the handle 31 to adjust the longitudinal axis of the clipping foot 55 to correspond to the longitudinal axis of the corresponding clipping hole 91 of the circuit board 90. The push pin 50 is impelled via the handle 31 to extend the clipping foot 55 through the corresponding clipping hole 91 of the circuit board 90, and the spring 70 is compressed. The push pin 50 is rotated 90° to set the longitudinal axis of the clipping foot 55 perpendicular to the longitudinal axis of the corresponding clipping hole 91. The push pin 50 is released, and the elastic force of the spring 70 abuts the clipping foot 55 with a bottom of the circuit board 90. Free ends of the insertion portions 33 of the plug 30 are in turn extended through the corresponding receiving holes 511 of the push pin 50, the spring 70, the corresponding through hole 21 of the heat sink 20, and the corresponding receiving hole 91 of the circuit board 90, until the raised points 35 of the plug 30 are snapped in the snapping hole 513 of the push pin 50. Thereby, the plug 30 is fixed with the push pin 50, and prevents the push pin 50 from rotating, thus securing the clipping foot 55 of push pin 50 with the circuit board 90. Thus, the heat sink 20 is firmly fixed to the circuit board 90 and closely contacts the heat generating element 100.

During removal, the plug 30 is pulled upward to disengage raised points 35 from the snapping hole 513 of the push pin 50. The push pin 50 is rotated 90° and withdrawn from the corresponding clipping hole 91 of the circuit board 90. The heat sink 20 is thus removable from the circuit board 90.

In other embodiments, one of the insertion portions 33 of the plug 30 and the corresponding receiving holes 511 may be omitted, and the raised point 35 of the plug 30 and the snapping hole 513 of the push pin 50 may replace each other.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastener comprising:
    a push pin comprising a head, a shaft extending from the head, and a clipping foot extending radially from the shaft, wherein two spaced receiving holes are defined in the head, a snapping hole is defined in the head and communicates with the receiving holes, and the shaft and the clipping foot are between the receiving holes;
    a plug comprising a handle, and two spaced inserted portions extending from the handle along an axis corresponding to the receiving holes of the push pin, wherein a raised point extends from an inner side of each of the insertion portions corresponding to the snapping hole of the push pin; and
    an elastic member;
    wherein the insertion portions of the plug are capable of extending through the corresponding receiving holes of the push pin until the raised points are snapped in the snapping hole of the push pin and the insertion portions of the plug extend adjacent to the clipping foot of the push pin, and the elastic member is capable of engaging with the push pin to supply an elastic force pointing from the clipping foot to the head of the push pin.

2. The fastener of claim 1, wherein the elastic member is a spring capable of being fitted about the shaft of the push pin and engaging with the head of the push pin.

3. The fastener of claim 1, wherein the clipping foot is symmetrical relative to the shaft.

4. The fastener of claim 1, wherein the clipping foot extends from an end of the shaft away from the head of the push pin.

5. A fastener comprising:
- a push pin comprising a head, a shaft extending from the head, and a clipping foot extending radially from the shaft, wherein a receiving hole is defined in the head;
- a plug comprising a handle, and an inserted portion extending from the handle corresponding to the receiving hole of the push pin; and
- an elastic member;
- wherein a snapping hole is defined in one of the head of the push pin and communicating with the receiving hole, and a raised point extends from the insertion portion of the plug, and the raised point is corresponding to the snapping hole;
- wherein the insertion portion of the plug is capable of extending through the receiving hole of the push pin until the raised point is snapped in the snapping hole and the insertion portion extends adjacent to the clipping foot of the push pin, and the elastic member is capable of engaging with the push pin to supply an elastic force from the clipping foot to the head of the push pin.

6. The fastener of claim 5, wherein the elastic member is a spring capable of being fitted about the shaft of the push pin and engaging with the head of the push pin.

7. The fastener of claim 5, wherein the clipping foot is symmetrical relative to the shaft.

8. The fastener of claim 5, wherein the clipping foot extends from an end of the shaft away from the head of push pin.

\* \* \* \* \*